(12) United States Patent
Rinaldi

(10) Patent No.: US 8,204,706 B2
(45) Date of Patent: Jun. 19, 2012

(54) DYNAMIC SYNCHRONIZATION SYSTEM AND METHODS

(75) Inventor: Vito Rinaldi, Markham (CA)

(73) Assignee: Cavet Holdings Limited, Ontario (CA)

( * ) Notice: Subject to any disclaimer, the term of this patent is extended or adjusted under 35 U.S.C. 154(b) by 89 days.

(21) Appl. No.: 12/717,770

(22) Filed: Mar. 4, 2010

(65) Prior Publication Data

US 2011/0218751 A1    Sep. 8, 2011

(51) Int. Cl.
*G01R 23/00* (2006.01)
(52) U.S. Cl. .......................................................... 702/75
(58) Field of Classification Search .................... 702/57, 702/60, 64, 66, 67, 70, 71, 73, 75, 79, 179, 702/183, 189
See application file for complete search history.

(56) References Cited

U.S. PATENT DOCUMENTS

| | | | | |
|---|---|---|---|---|
| 4,559,602 A | * | 12/1985 | Bates, Jr. | 702/71 |
| 4,672,555 A | * | 6/1987 | Hart et al. | 700/276 |
| 6,112,136 A | | 8/2000 | Paul et al. | |
| 6,674,248 B2 | | 1/2004 | Newman, Jr. et al. | |
| 6,784,622 B2 | | 8/2004 | Newman, Jr. et al. | |
| 2010/0007284 A1 | | 1/2010 | Otte | |

FOREIGN PATENT DOCUMENTS

| | | |
|---|---|---|
| CA | 2684566 | 11/2008 |
| CA | 2699586 | 3/2009 |
| CA | 2698606 | 4/2009 |

OTHER PUBLICATIONS

PCT, "International Search report," Jun. 16, 2011, pp. 1-5.
PCT, Written Opinion of the International Searching Authority, Jun. 16, 2011, pp. 1-3.
PCT, International Search Report, Jun. 17, 2011, pp. 1-4.
PCT, Written Opinion of the International Searching Authority, Jun. 17, 2011, pp. 1-6.
PCT, International Search Report, Jun. 23, 2011, pp. 1-5.
PCT, Written Opinion, Jun. 23, 2011, pp. 1-6.
U.S. Appl. No. 12/706,188, filed Feb. 16, 2010, Rinaldi.
U.S. Appl. No. 12/706,243, filed Feb. 16, 2010, Rinaldi.

* cited by examiner

*Primary Examiner* — Mohamed Charioui
(74) *Attorney, Agent, or Firm* — Haynes and Boone, LLP

(57) ABSTRACT

A method and system for continuously predicting an input line power waveform frequency of alternating current having maximum and minimum values, and a reference value located therebetween by specifying an outer window defining a sense point of the waveform between lower and upper limits of the outer window, the sense point being located away from the reference value and having a corresponding predicted sense point time; providing an inner window having an inner time interval less than an outer time interval corresponding to time between the lower and upper limits; positioning the inner window at the predicted sense point time; identifying an actual sense point time of a measured inner sense point value and excluding one or more identified actual outer sense point values being both outside of the inner time interval and within the outer time interval; and calculating the frequency of a future cycle of the waveform.

20 Claims, 8 Drawing Sheets

DYNAMIC SYNCHRONIZATION SYSTEM AND METHODS

FIELD OF THE INVENTION

This invention relates to the identification of frequency for potential variable frequency environments, and particularly, a system and methods for achieving the same.

BACKGROUND OF THE INVENTION

As energy costs increase and the use of electric lighting and motors expands, more and more attention is being given to the design of efficient electrical systems. In today's environment of power conservation, power reduction systems are available to make reductions in available line power for subsequent application to varied loads, such as lighting systems. One such example is described in U.S. Pat. No. 6,525,490 for Power Saving Circuitry. However, synchronization of the power reduction systems can become problematic for experienced variations in line power frequency.

In practice the nominal frequency is raised or lowered by a specific percentage to maintain synchronization. In the synchronous grid of Continental Europe, the deviation between network phase time and UTC is calculated at 08:00 each day in a control center in Switzerland, and the target frequency is then adjusted by up to ±0.02% from 50 Hz as needed. In North America, whenever the error exceeds 10 seconds for the east, 3 seconds for Texas, or 2 seconds for the west, a correction of ±0.02 Hz (0.033%) is applied. The trend in system frequency is a measure of mismatch between demand and generation, and so is a necessary parameter for load control in interconnected systems. During a severe overload caused by tripping or failure of generators or transmission lines the power system frequency will decline, due to an imbalance of load versus generation. Loss of an interconnection, while exporting power (relative to system total generation) will cause system frequency to rise. Temporary frequency changes are an unavoidable consequence of changing demand. Exceptional or rapidly changing mains frequency is often a sign that an electricity distribution network is operating near its capacity limits, dramatic examples of which can sometimes be observed shortly before major outages.

Further, it is recognised that for smaller power systems, such as for emergency building generators, may not maintain frequency with the same degree of accuracy for larger power generation networks.

Further, it is recognised other variations can occur in line power, such as voltage/current fluctuation due to noise introduced into the supply line, which can affect synchronization between power reduction equipment and the line power.

SUMMARY OF THE INVENTION

In one embodiment the present invention advantageously provides a synchronization system to address at least one of the above presented problems.

It is recognised that for power systems providing line power may not maintain the frequency with the degree of accuracy required for maintaining synchronization with power reduction systems. Further, it is recognised other variations can occur in line power, such as voltage/current fluctuation due to noise introduced into the supply line, which can affect synchronization between power reduction equipment and the line power. Contrary to present methods and systems, there is provided a method and system for continuously predicting a frequency of an input line power waveform of alternating current having a maximum value, a minimum value, and a reference value located between the maximum and minimum values. The method comprises the steps of specifying an outer window defining a sense point of the waveform between a lower limit and an upper limit of the outer window, the sense point being located away from the reference value, the sense point having a corresponding predicted sense point time; providing an inner window having an inner time interval less than an outer time interval corresponding to time between the lower limit and the upper limit; positioning the inner window at the predicted sense point time; identifying an actual sense point time of a measured inner sense point value of the sense point in the inner time interval and excluding one or more identified actual outer sense point values of the sense point being both outside of the inner time interval and within the outer time interval; and calculating the frequency of a future cycle of the waveform based on the actual sense point time.

A first aspect provided is a method for continuously predicting a frequency of an input line power waveform of alternating current having a maximum value, a minimum value, and a reference value located between the maximum and minimum values, the method comprising the steps of: specifying an outer window defining a sense point of the waveform between a lower limit and an upper limit of the outer window, the sense point being located away from the reference value, the sense point having a corresponding predicted sense point time; providing an inner window having an inner time interval less than an outer time interval corresponding to time between the lower limit and the upper limit; positioning the inner window at the predicted sense point time; identifying an actual sense point time of a measured inner sense point value of the sense point in the inner time interval and excluding one or more identified actual outer sense point values of the sense point being both outside of the inner time interval and within the outer time interval; and calculating the frequency of a future cycle of the waveform based on the actual sense point time.

A second aspect provided is a system for continuously predicting a frequency of an input line power waveform of alternating current having a maximum value, a minimum value, and a reference value located between the maximum and minimum values, the system comprising: an outer window module to specify an outer window defining a sense point of the waveform between a lower limit and an upper limit of the outer window, the sense point being located away from the reference value, the sense point having a corresponding predicted sense point time; an inner window module to provide an inner window having an inner time interval less than an outer time interval corresponding to time between the lower limit and the upper limit; and a processor module to position the inner window at the predicted sense point time, to identify an actual sense point time of a measured inner sense point value of the sense point in the inner time interval and excluding one or more identified actual outer sense point values of the sense point being both outside of the inner time interval and within the outer time interval, and to calculate the frequency of a future cycle of the waveform based on the actual sense point time.

A further aspect is where the outer window module includes a circuit and the multiplication factor is determined by a variable impedance value of the circuit connected to the waveform via a series resistance element, such that a ratio between the impedance value and the series resistance element defines the multiplication factor.

BRIEF DESCRIPTION OF THE DRAWINGS

In order that the subject matter may be readily understood, embodiments are illustrated by way of examples in the accompanying drawings, in which.

DETAILED DESCRIPTION OF PREFERRED EMBODIMENTS

Figure 1:
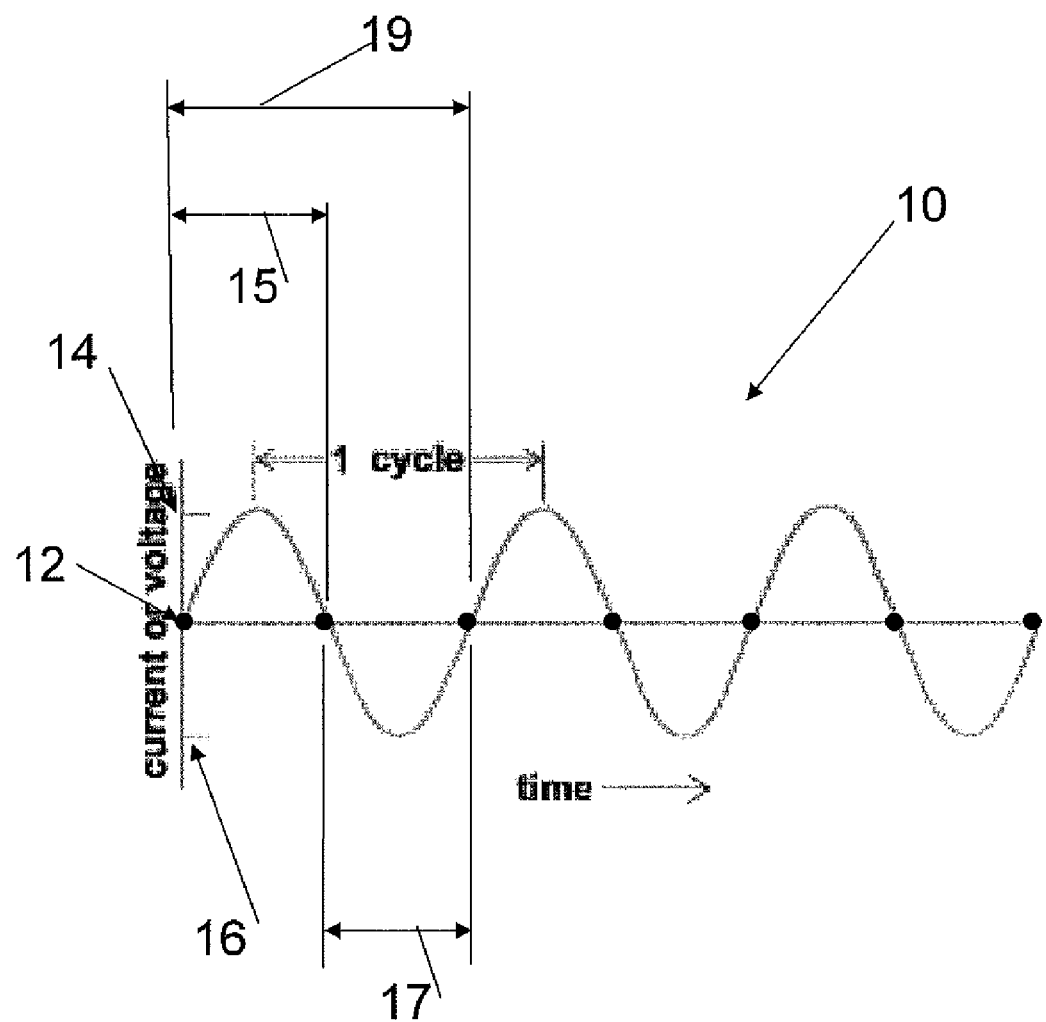
FIG. 1 is shows an alternating power waveform in an embodiment of the invention.

For convenience, like numerals in the description refer to like structures in the drawings.

Current/Voltage Waveform 10

In general, alternating electric current (and corresponding voltage) varies periodically in value and direction, first flowing in one direction in a circuit and then flowing in the opposite direction; such that each complete repetition is called a cycle, where the electric current rises to a maximum in the one direction, falls back to a reference value (e.g. zero) and then rises to a maximum in the opposite direction and then repeats. The number of repetitions per second is called the frequency; usually expressed in Hertz (Hz). The cross over point between the cycles is the reference value of the electric current (and corresponding voltage), for example 0 Volts or 0 Amperes.

Referring to FIG. 1, alternating current/voltage 10 is defined as the flow of electric charge that reverses periodically about a reference point 12. The current/voltage 10 starts from the reference value 12 (e.g. zero), grows to a maximum value 14 and then decreases again to the reference value 12 in a first half cycle 15. The current/voltage 10 then reverses direction to reach a minimum value 16 in a direction opposite from the reference value 12 (as compared to the direction towards the maximum value 14) and then returns again to the reference value 12 in a second half cycle 17, and repeats the half cycles 15,17 in alternate.

The time taken to complete one cycle 19 (as a combination of the two half cycles 15,17) is called a period, and the number of cycles 19 per second is defined as the frequency f of the current/voltage 10. Further, the maximum value 14,16 in either direction is the current's/voltage's amplitude. Examples of frequencies F are 50-60 cycles per second (i.e. 50-60 Hz) used for domestic and commercial power. It is recognised that the current/voltage 10 can be other frequencies F, such as higher frequencies F used in television (e.g. 100 MHz) and in radar and microwave communication (e.g. 2.5 GHz).

Accordingly, one complete period, with current flow first in one direction and then in the other, is called the cycle 19 of the current/voltage 10, and 60 cycles per second (60 hertz) is the customary average frequency F of alternation in the United States and in all of North America. In Europe and in many other parts of the world, the customary average frequency F is 50 Hz. One example of a custom/specialized frequency F for the current/voltage 10 is on aircraft, approximately 400 Hz, that is used to make possible lighter weight electrical machines.

Figure 2:
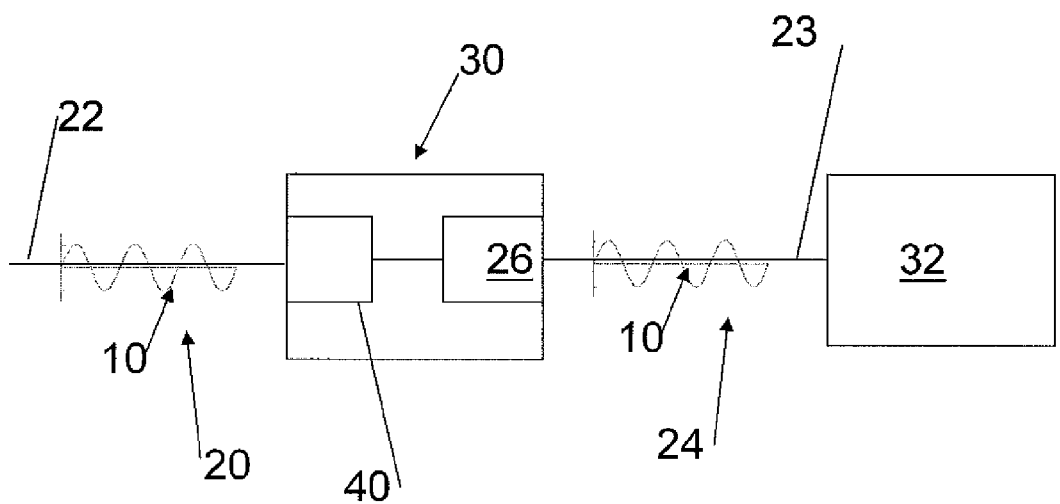
FIG. 2 is a block diagram of synchronization system embodiment for processing the power waveform of FIG. 1.

In view of FIG. 1, it is recognised that a sinusoidal form of current, or voltage 10, is usually approximated on practical power systems (used to generate and supply the voltage/current 10 as line power 20—see FIG. 2) because the sinusoidal form can provide for less expensive construction and greater efficiency of operation for line power 20 electric generators, transformers, motors, and other machines. However, in certain applications, different waveforms are used, such as but not limited to: triangular or square waves. Audio and radio signals carried on electrical wires (or other electrical conductive elements) are also examples of alternating current/voltage 10.

Noise

Referring again to FIG. 1, it is recognised that variations from the nominal operational voltage or current 10 value on a power or signal line 22 (see FIG. 2) can occur, such that the actual voltage/current 10 value fluctuates about or away from the theoretical or steady state values defined for the particular waveform of the supplied voltage/current 10. For example, in electronics and communication systems, noise is a random fluctuation or variation of an electromagnetic analog signal such as the voltage/current 10, which can consists of sudden step-like transitions between two or more levels (non-Gaussian) at random and unpredictable times.

Controller 30

Referring to FIG. 2, shown is a controller device 30 for monitoring the line power 20 transmitted on a carrier medium 22 (e.g. transmission wire/line) for consumption by a load 32. It is recognised that one example of the controller 30 is as a power control device for introducing (and managing) a customizable reduction in AC power 24 modified from the main line power supply 20 and subsequently supplied via a load line 23 to the load 32 (e.g. a series of fluorescent lights in a building). The power reduction exhibited in the modified AC power 24 is provided by introducing controlled pulse cut-outs 26 (e.g. a single/multiple pulse structure consisting of one or more cut outs in each half cycle) in the main line voltage/current 10 waveform of the line power 20. The aim of the controller device 30 is to reduce power consumption of the coupled lighting loads 32, while at the same time inhibiting substantive lighting intensity differences of the lighting load 32 as perceived by the user.

The controller device 30 has a synchronization system 40 for determining the frequency F of the current/voltage 10 of the supplied line power 20 as well as the cross over points 12 (see FIG. 1) used to define the start and stop of each half cycle 15,17. It is recognised that determined frequency F and associated cross-over points 12 can be used to coordinate application of the controlled pulse cut-outs 26 to the supplied line power 20.

Example Controller Device 30

Figure 3:
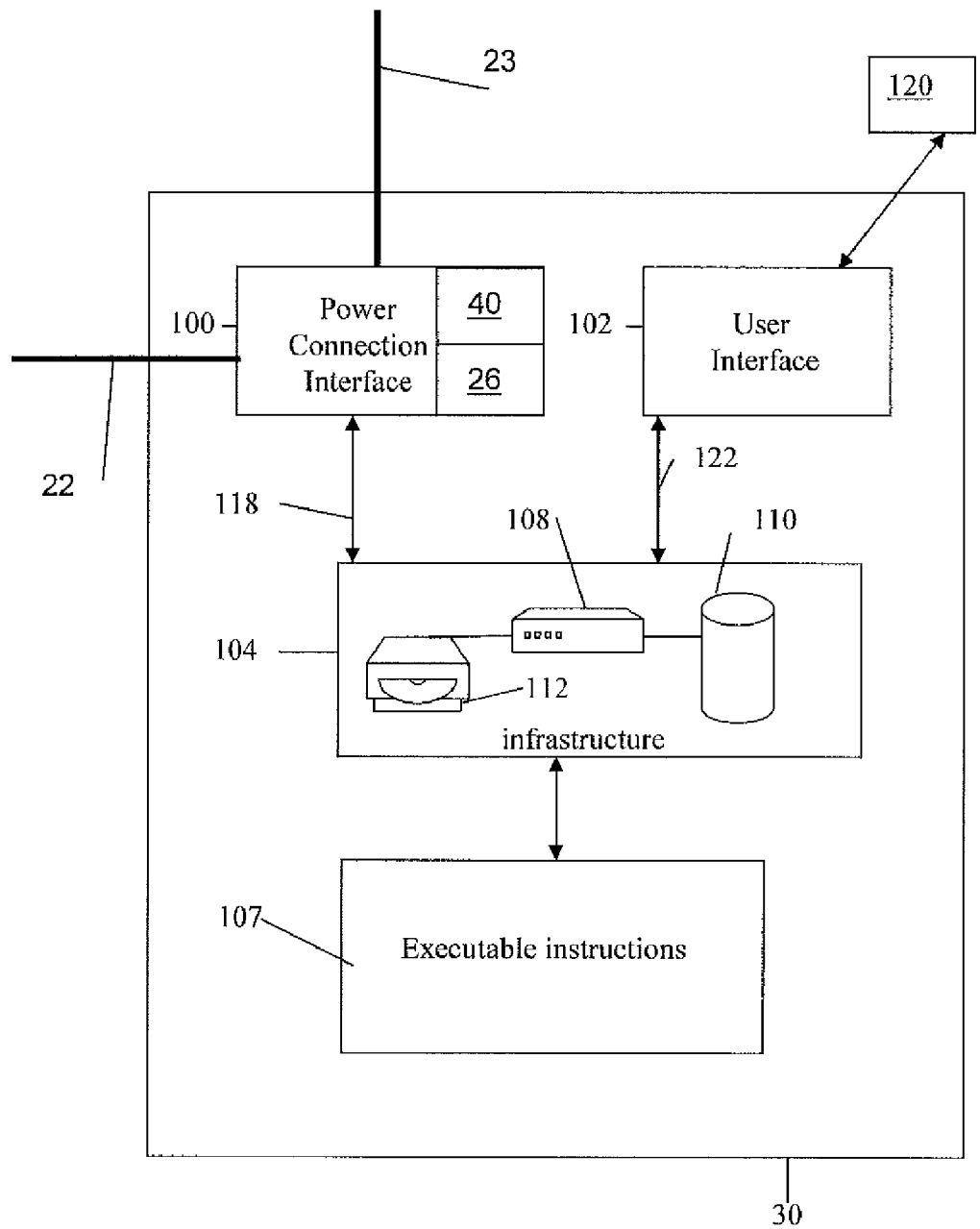
FIG. 3 is a block diagram of a controller device for implementing the synchronization system of FIG. 2.

Referring to FIGS. 2 and 3, the controller device 30 includes a power connection interface 100 for coupling the controller device 30 to the supply line 22 and to the load line 23. For example, the synchronization system 40, the cut-out process 26, or portion(s) thereof, can be included as part of, or separate to, the power connection interface 100.

The controller device 30 can also have a user interface 102, coupled to a device infrastructure 104 by connection 122, to interact with the user, for supplying control parameters 120 (e.g. to affect the operation of the synchronization system 40 and/or the application of the cut-outs 26) affecting the operation of the controller device 30. The user interface 102 can include one or more user input devices such as but not limited to a QWERTY keyboard, a keypad, a stylus, a mouse, a microphone and the user output device such as an LCD screen display and/or a speaker. If the screen is touch sensitive, then the display can also be used as a graphical user input device as controlled by the device infrastructure 104.

Referring again to FIG. 3, operation of the controller device 30 is facilitated by the device infrastructure 104. The device infrastructure 104 includes one or more computer processors 108 (e.g. microprocessors) and can include an associated memory 110 (e.g. a random access memory). The computer processors 108 facilitate performance of the controller device 30 configured for the intended task(s) through operation of the respective synchronization system 40 and cut-outs 26, the user interface 102, and any other application programs/hardware 107 of the controller device 30 (e.g. modules 42, 46, 50—see FIG. 4) by executing task related instructions. These task related instructions can be provided by an operating system, and/or software applications 107 located in the memory 110, and/or by operability that is configured into the electronic/digital circuitry of the processor(s) 108 designed to perform the specific task(s). Further, it is recognized that the device infrastructure 104 can include the computer readable storage medium 112 coupled to the processor 108 for providing instructions to the processor 108 and/or to load/update the instructions 107. For example, one or more of the processors 108 could be included directly in the synchronization system 40. Communication between the device infrastructure 104 and the power connection interface 100 is via link 118. For example, the processor 108 of a processor module 50 could be a microprocessor having a sensing port to sense voltage sense point values 43 (see FIG. 4), as further described below. It is also recognised that an outer window module 42 could include a circuit 60, see FIG. 4, for connection to the waveform 10 power line 22 (see FIG. 1), as further described below.

The computer readable medium 112 can include hardware and/or software such as, by way of example only, magnetic disks, magnetic tape, optically readable medium such as CD/DVD ROMS, and memory cards. In each case, the computer readable medium 112 may take the form of a small disk, floppy diskette, cassette, hard disk drive, solid-state memory card, or RAM provided in the memory module 110. It should be noted that the above listed example computer readable mediums 112 can be used either alone or in combination.

Further, it is recognized that the controller device 30 can include the executable applications 107 comprising code or machine readable instructions for implementing configurable functions/operations including those of an operating system and the synchronization system 40, for example. The processor 108 as used herein is a configured device and/or set of machine-readable instructions for performing operations as described by example above. As used herein, the processor 108 may comprise any one or combination of, hardware, firmware, and/or software. The processor 108 acts upon information by manipulating, analyzing, modifying, converting or transmitting information for use by an executable procedure or an information device, and/or by routing the information with respect to an output device. The processor 108 may use or comprise the capabilities of a controller or microprocessor, for example. Accordingly, any of the functionality of the controller device 30 may be implemented in hardware, software or a combination of both. Accordingly, the use of a processor 108 as a device and/or as a set of machine-readable instructions is hereafter referred to generically as a processor/module for sake of simplicity.

The memory 110 is used to store any executable applications 107 as well as any control parameters 120 associated with the synchronization system 40 and cut-outs 26 processes. General data structure types of the memory 110 can include types such as but not limited to an array, a file, a record, a table, a tree, and so on. In general, any data structure is designed to organize data to suit a specific purpose so that the data can be accessed and worked with in appropriate ways. In the context of the present environment, the data structure may be selected or otherwise designed to store data for the purpose of working on the data with various algorithms executed by components of the controller device 30. It is recognised that the terminology of a table is interchangeable with that of a data structure.

Synchronization System 40

Figure 4:
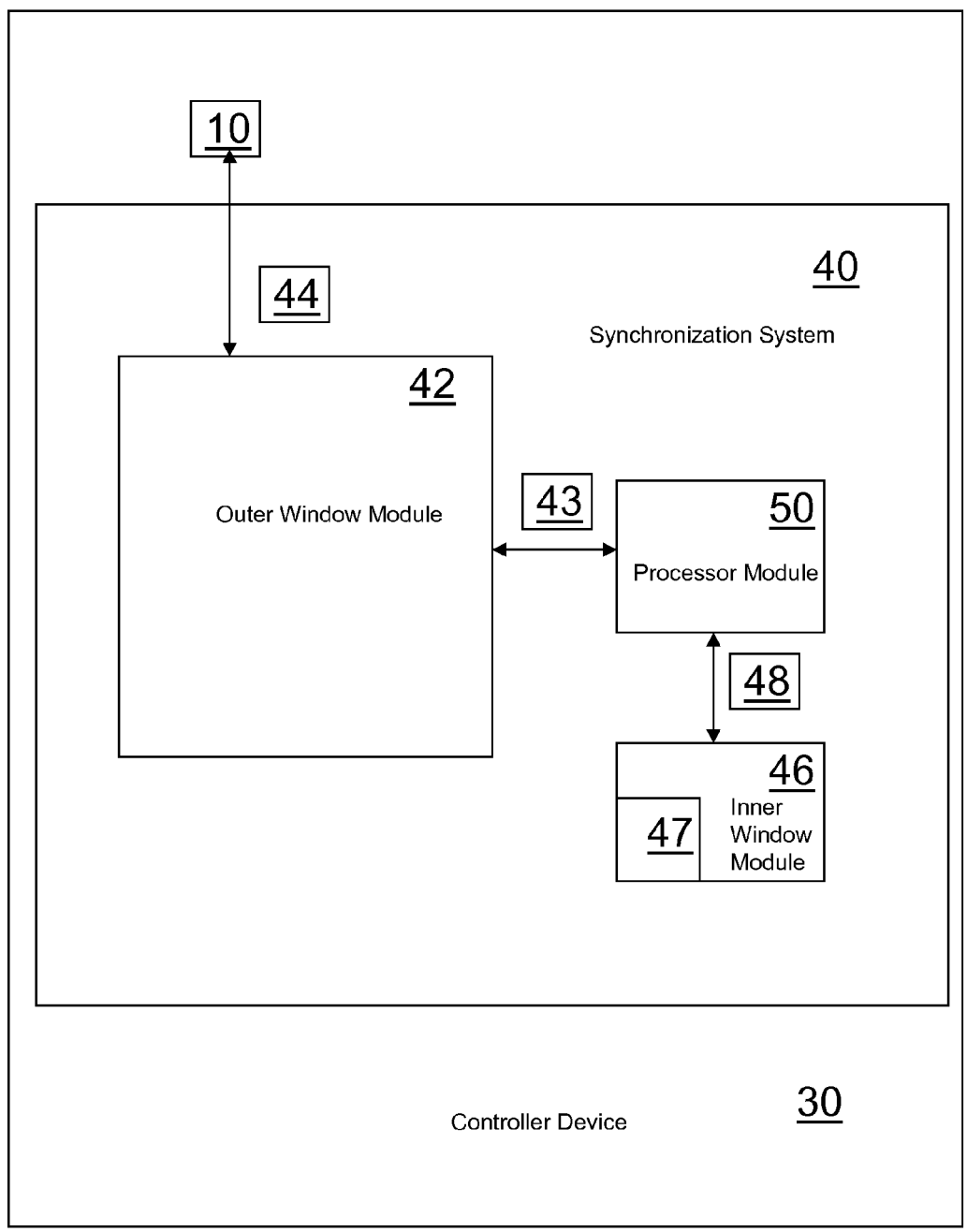
FIG. 4 is a further embodiment of the synchronization system of FIG. 2.
Figure 5A:
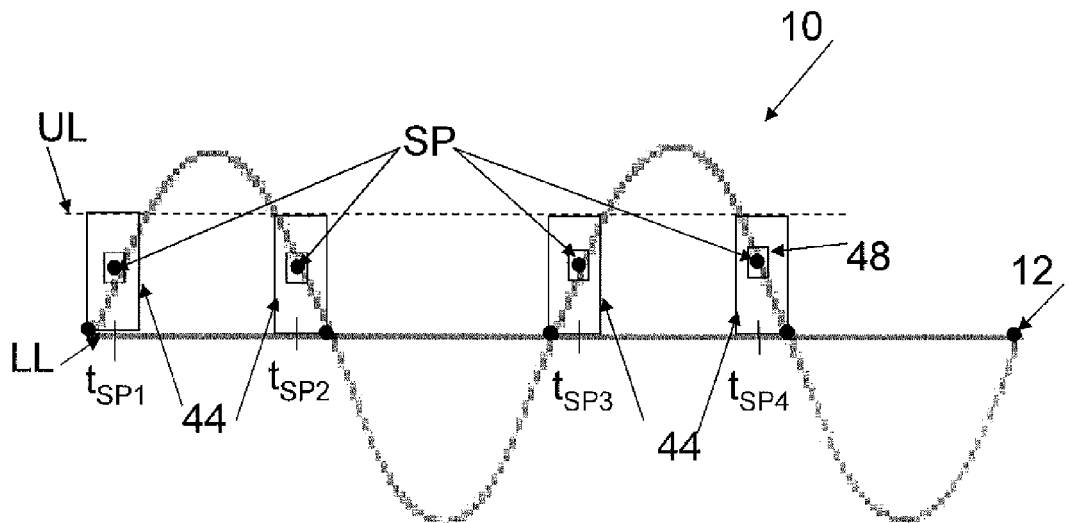
FIG. 5a,b show power waveform timing used by the synchronization system of FIG. 4.

Referring to FIGS. 4 and 5a, shown is the synchronization system 40 of the controller device 30. The system 40 has an outer window module 42 for facilitating the detection of predefined sense point values 43 (e.g. voltage values at corresponding sense point times tsp1, tsp2, tsp3, tsp4, etc.) in the waveform 10 using a defined outer window 44 having a voltage range between a voltage upper limit UL and a voltage lower limit LL applied to the waveform 10, an inner window module 46 for defining an inner window 48 (e.g. a defined time interval delta t) within the defined outer window 44, and a processor module 50 for determining the frequency F of the waveform 10 based on the detected sense point values 43 filtered by the inner window 48, as further described below. It is recognised that the sense point values 43 could also be current values of the waveform 10, as desired, and the limits LL,UL would also be defined as current values.

Outer Window Module 42

Figure 5B:
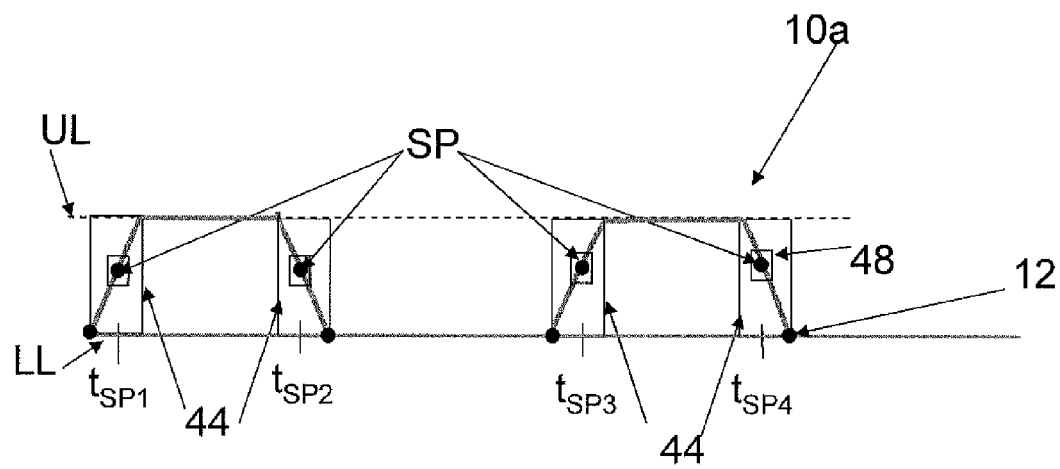
Figure 6:
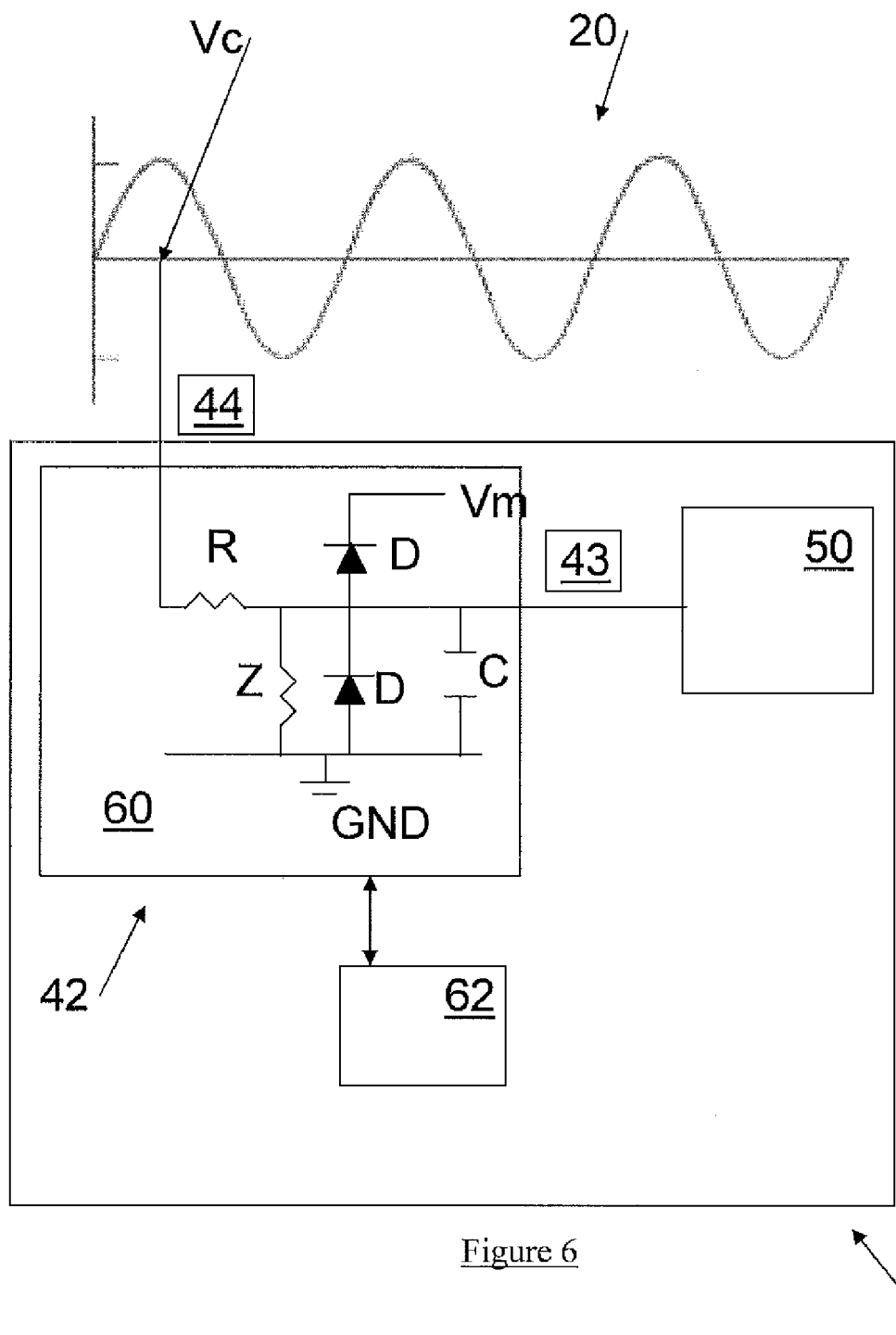
FIG. 6 is a further embodiment of the synchronization system of FIG. 4.

Referring to FIG. 6, shown is a circuit 60 as an example embodiment of the outer window module 42. The circuit 60 is used to process the waveform 10 using the defined outer window 44 as the voltage range having the sensing point SP between the upper limit UL of the window 44 and the lower limit LL of the window 44. FIG. 5b shows an example resulting waveform 10a processed by the outer window 44 provided by the example circuit 60. It is recognised that the lower limit LL as shown in FIG. 5b is the same as the reference value 12 by example only. Further, it is recognised that the sensing point SP of the window 44 can defined as partway (e.g. halfway) between the upper limit UL and the lower limit LL, as provided/defined by the specified components of the circuit 60. In any event, it is recognised that the sensing point SP on the waveform 10 (e.g. the voltage sense point) is located away from the reference value 12 of the waveform 10. The distance of the sensing point SP away from the reference value 12 of the waveform 10 is dependent upon the size (e g limits UL,LL) of the window 44, as further described below. It is recognised that it is advantageous to position the sensing point SP away from the reference value 12, as waveform 10 noise levels (e.g. fluctuations in the voltage/current) can be higher in the vicinity of the reference value 12. Further, it is recognised that the highest rate of change in the voltage/current of the waveform 10 is experienced in the vicinity of the reference value 12, which may affect the accuracy of sensing the voltage/current when one is closer to the reference value 12.

Referring again to FIG. 6, the circuit 60 includes a connection Vc to the line power 20, a resistive element R (e.g. a series of resistors totaling 200 k Ohms), an impedance Z, a pair of directional elements (e.g. diodes D) to promote electric current in one direction (called the diode's forward direction) while blocking current in the opposite direction (the reverse direction), an module electrical potential difference (e.g. voltage) Vm and corresponding ground GND (i.e. reference point in the electrical circuit 60 from which other voltages are measured), and an optional capacitance C to inhibit high frequency.

The components (e.g. R, Z, D, Vm, C) of the circuit 60 are used to define/configure the voltage limits UL,LL as well as the positioning (i.e. voltage value) of the sense point SP in the window 44 between the limits UL,LL. For example, the sense point SP can be defined/configured as halfway between the limits UL,LL. Selection of the ratio between the impedance value Z and resistance value R provides for a dynamic selection of the size of the window 44, e.g. the value of the upper limit UL, the lower limit LL, and the defined sense point SP. For example, having a defined lower limit LL of 0 Volts and a selected Vm of 5 Volts, would give a base 5 Volts for the upper limit UL and a sense point value SP of 2.5 Volts (i.e. the window of 0-5 Volt range with a midrange sense point of 2.5 Volts). Changing of the ratio between the R and Z values of the circuit provides for a multiplication factor for the limits LL,UL and the sensing point SP, for example: a line 20 with a divider value of 2:1 500K for R and 500K for Z would provide the unit to work from 6 VAC to 600 VAC and beyond. At 6 volt AC (8.5V peak) the half voltage of 3 volts (4.25 V peak) will still provide the sync system to work. At 600V the resistor current would be less than 2 mA and is within example power/voltage limits of the resistors. The diodes D limit the sense signals from 0 to 5 volt levels. Using a similar, or the same voltage divider, one can determine the peak voltage and adjust the expected zero cross accordingly. However for most line voltages (ie: 120V to 347 V line-neutral) the time difference is negligible, but can still be adjusted for precision. This will provide accurate line 20 frequency, line 20 phase angle and variable tracking for both.

It is recognised that the selected (by the outer window module 42) multiplication factor of the sensing point SP can be dependent upon the amplitude of the waveform 10. For example, for an amplitude of 6 volts for the waveform 10, the window 42 of 0-5 volts with a sensing point SP of 2.5 volts can be used. If the amplitude of the waveform 10 is 600 volts, then the sensing point of 2.5 volts may be deemed to close to the reference point 12 (or 0 volts) and appropriate selection of the multiplication factor of 10, for example, would place the window 42 as 0-50 volts with the sensing point of 25 volts further away from the reference point 12.

In one embodiment, the impedance element Z can be dynamically selected/changed in the circuit 60 by the module 42 based on the waveform 10 amplitude. A table 62 (or other data structure) can be used by the window module 42 to select the appropriate impedance value Z that corresponds to the identified waveform 10 amplitude. This impedance value Z selection can be performed manually by a user of the controller device 30, based on manual settings identified on the user interface 102, and/or can be performed automatically by the module 42 based on automatic impedance Z selection mechanisms.

Figure 7:
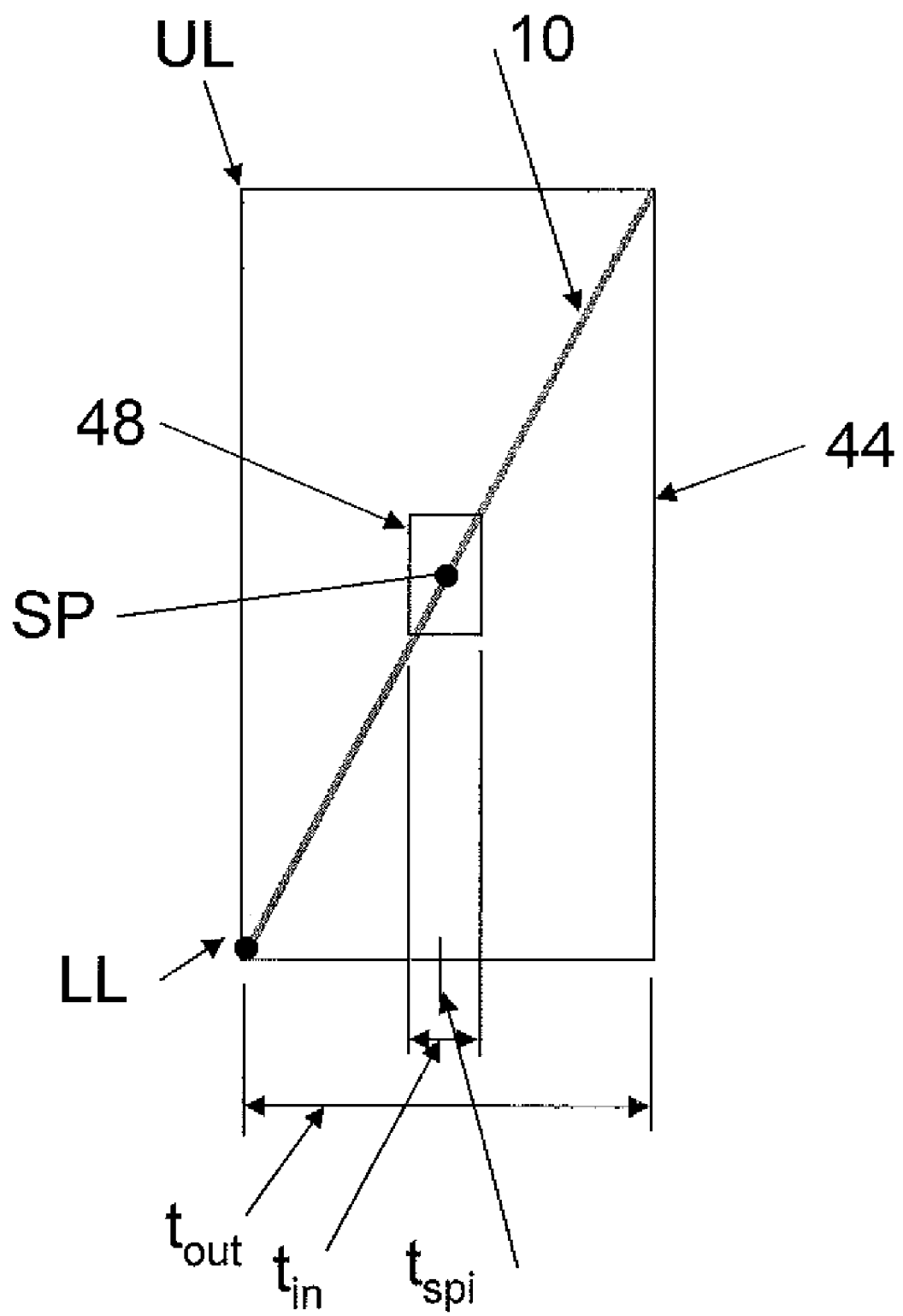
FIG. 7 shows application of an inner window of synchronization system of FIG. 4.

Referring to FIG. 7, it is recognised that for larger voltage ranges (as defined by distance between the limits LL-UL), a corresponding longer outer time interval Tout is associated therewith, such that there is greater opportunity for erroneous voltage sense values 43 (see FIG. 6) to be detected in the time interval Tout due to random fluctuations in the waveform 10. Accordingly, the inner window 48 is defined about the sense point SP to provide for a reduced/inner time interval Tin positioned about the sense point time Tsp1, in order to provide for the processor module 50 to ignore any sense point values 43 matching the sense point voltage(s) (defined by the outer window 42) that are outside of the inner window 48. In other words, any sense point values 43 that match the defined sense point SP in the time interval Tout are ignored except for those sense point values 43 that are within the reduced inner time interval Tin. It is recognised that the inner time interval Tin is less that the outer time interval Tout.

Inner Module 46

Referring to FIGS. 4 and 7, the inner window module 46 is configured for defining the inner window 48 (e.g. the defined time interval Tin) within the defined outer window 44, which is used by the processor module 50 to filter or otherwise to exclude the sense point values 43 obtainable from the waveform 10 in the outer window 44 that are not within the inner window 48.

The value of Tin (the inner window 48) can be calculated based on an acceptable rate of change expected in the frequency F of the waveform 10. It is recognised that the frequency F of the waveform 10 can change over the course of power generation of the waveform 10 due to a number of factors. For example, the line frequency (American English) or mains frequency (British English) is the frequency F at which alternating current (AC) (i.e. waveform 10) is transmitted from a power plant to the end user on the power medium 22 (see FIG. 2). It is also recognised that the line power 20 could be produced by a local generator (e.g. diesel generator) that is susceptible to fluctuations in frequency F.

Accordingly, regulation of the line power 20 frequency is done for a daily average frequency so that clocks stay within a few seconds of correct time. In practice the nominal frequency of the line power 20 is raised or lowered by a specific percentage to maintain synchronization by large power generating stations. Over the course of a day, the average frequency is maintained at the nominal value within a few hundred parts per million. For example, the synchronous grid of Continental Europe, the target frequency is adjusted by up to ±0.02% from 50 Hz as needed. In North America, whenever the error exceeds 10 seconds for the east, 3 seconds for Texas, or 2 seconds for the west, a correction of ±0.02 Hz (0.033%) is applied. Smaller power systems (e.g. building emergency power generators) may not maintain frequency with the same degree of accuracy, as it is recognised that the trend in line power frequency F is a measure of mismatch between demand and generation.

During a severe overload caused by tripping or failure of generators or transmission lines the power system frequency will decline, due to an imbalance of load versus generation. Loss of an interconnection, while exporting power (relative to system total generation) will cause system frequency to rise. Control systems in power plants detect changes in the network-wide frequency and adjust mechanical power input to generators back to their target frequency. This counteracting usually takes a few tens of seconds due to the large rotating masses involved. Temporary frequency changes are an unavoidable consequence of changing demand. Exceptional or rapidly changing mains frequency is often a sign that an electricity distribution network is operating near its capacity limits, dramatic examples of which can sometimes be observed shortly before major outages. Smaller power systems, not extensively interconnected with many generators and loads, may not maintain frequency with the same degree of accuracy. Where system frequency is not tightly regulated during heavy load periods, the system operators may allow system frequency to rise during periods of light load, to maintain a daily average frequency of acceptable accuracy.

Accordingly, a step change in the frequency F of the line power 20 (as exhibited in the frequency F of the current/voltage of the waveform 10) is predefined for use in calculating the inner window 48 by the inner window module 46. For example, for an allowed 10 percent change in frequency F in one second of the line power 20, for a nominal 60 Hz has one cycle in 16.67 ms and 10 percent of that is 1.667 ms, such that the Tin of the window 48 would be ⅟₆₀ of the 10 percent or Tin=1.667 ms/60=0.028 ms. The inner window module 46 can have a table 47 (or other data structure—see FIG. 4) for having a list of Tin values based on defined allowed step changes (e.g. percent change in frequency in a defined time period) for the frequency F of the line power 20. Selection from the table 47 of Tin could be done by the user through control parameters 120 via the user interface 102, for example. For example, the value of Tin used for line power 20 supplied for grid power systems may be less that the value of Tin used for line power 20 supplied by emergency generators.

Processor Module 50

Referring to FIG. 4, the processor module 50 is configured to determine/update the frequency F of the waveform 10 based on the detected sense point values 43 that are in the inner windows 48 distributed along the waveform 10. In view of the fact that waveform 10 frequency F can shift, the processor module continually senses the sense point SP values 43 in the inner windows 48 (see FIG. 5a,b) in order to calculate the frequency F for the next upcoming cycle 19 (see FIG. 1).

For example, upon start-up of the controller device 30 with respect to line power 20 sensing, the inner window 48 may be ignored in order to determine the pattern of adjacent sense point times Tsp1, Tsp2, Tsp3, Tsp4, etc. that are associated with the sense point values SP that are identified in the outer sense point windows 44. Knowledge of the waveform 10 amplitude, form (e.g. sinusoidal), and the distribution of the sense point times Tsp1, Tsp2, Tsp3, Tsp4 and corresponding sense point voltage values 43 (e.g. midway between the limits UL,LL) with respect to one another provides for an initial determination by the processor module 50 of the waveform frequency F, and the next predicted sense point times Tspi (see FIG. 7) that will follow the detected/identified pattern of distribution of the sense point times Tsp1, Tsp2, Tsp3, Tsp4 used to calculate the initial waveform frequency F.

For example, an AC voltage v(t) can be described mathematically as a function of time by the following equation: $v(t)=V_{Peak}\cdot\sin(\omega t)$, where $V_{peak}$ is the peak voltage (i.e. voltage amplitude of the waveform 10) and $\omega$ is the angular frequency (unit: radians per second). The angular frequency is related to the physical frequency, f(unit=hertz), which represents the number of cycles per second, by the equation $\omega=2\pi f$, where t is the time (unit: second).

Once the waveform frequency F is determined and the time position on the waveform 10 is known, the next predicted sense point times Tspi are known/determined by the processor module 50 and the inner window 48 can be positioned about the predicted sense point times Tspi, in order to exclude any sense point values 43 located outside of the inner window used to determine the waveform 10 frequency F for the next cycle 19 of the waveform 10. As discussed above, knowledge of the waveform 10 frequency F for the upcoming cycle 19 (and half cycles 15,17) can be used to determine the period of the upcoming cycle(s) 19 and the time Tref of the reference values 12 can be determined (e.g. via the mathematical equation of the waveform and the reference value 12).

In this manner, the frequency of the waveform 10 is predicted for one or more of the upcoming cycle(s) 19 using the sense point times Tsp1,2 of the previous cycle 19 (or averaged for a selected number of previous cycles 19) for those sense point values 43 identified in the inner window 48. It is recognised that the measured sense point values and their associated sense point times Tspi can be used to predict the frequency F of at least one of the next upcoming cycles 19.

Accordingly, synchronization of the timer circuit of the cut-off 26 application/insertion process with the timing of the main line voltage waveform 10 is done by automatically determining frequency F and other timing characteristics in the main line voltage waveform 10, using application of a variable inner sensing window 48 to the waveform 10 to sequence/position the cut-off pulse structure appropriately in the waveform 10. The synchronization method may also be used to detect potential non-uniformity of the main supply line power 20, as desired.

Operation of the Synchronization System 40

Figure 8:
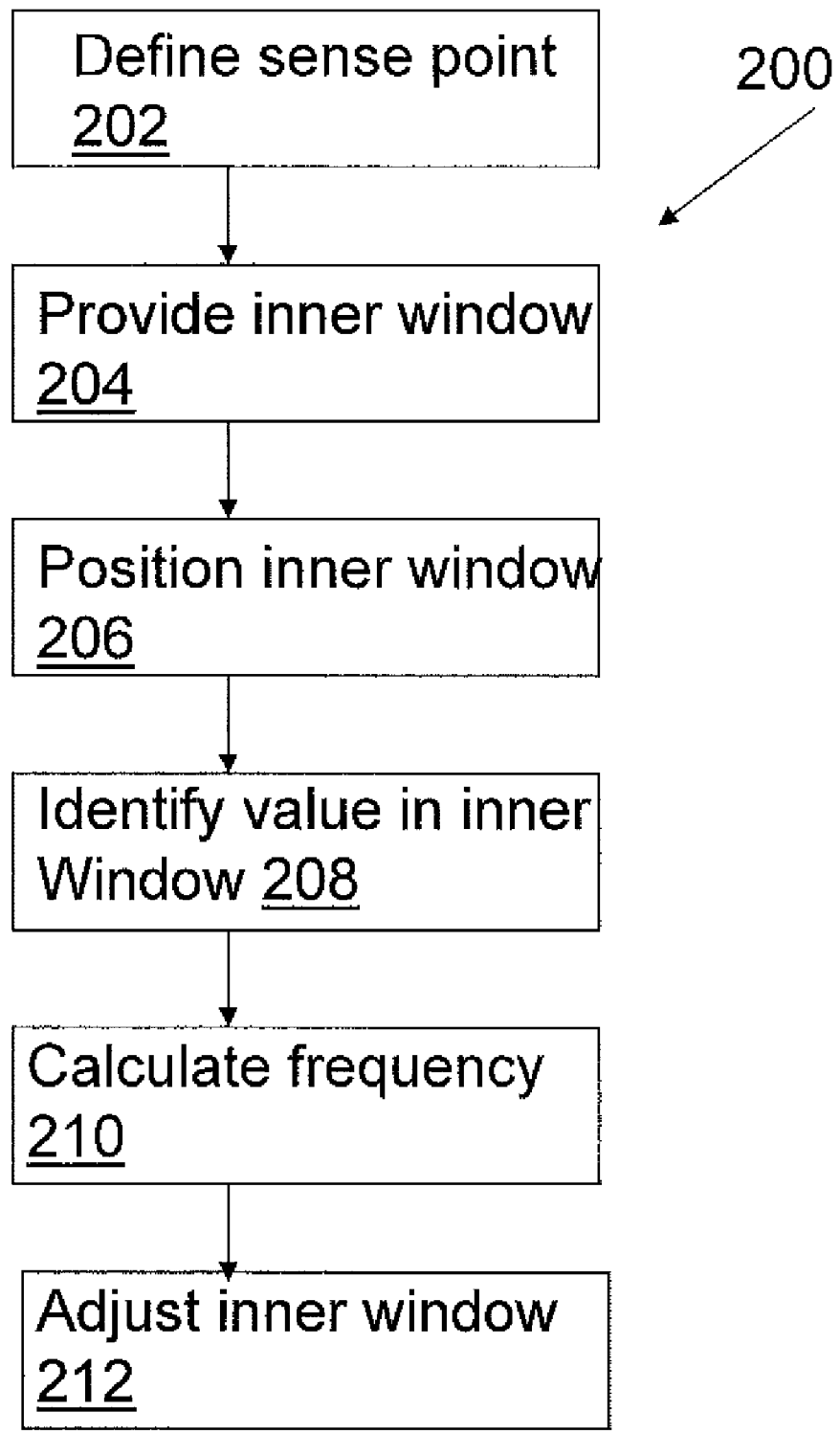
FIG. 8 is an example operation of the synchronization system of FIG. 4.

Referring to FIGS. 4 and 8, shown is a method 200 of predicting a frequency F of an input line power waveform 10 of alternating current having a maximum value (e.g. voltage peak), a minimum value, and a reference value 12 (e.g. zero volts as the cross over point) located between the maximum and minimum values. At step 202, the outer window module 42 specifies an outer window 44 defining a sense point SP of the waveform 10 between a lower limit LL and an upper limit UL of the outer window 48, the sense point SP being located away from the reference value 12, the sense point SP having a corresponding predicted sense point time Tspi. At step 204, the inner module 46 provides an inner window 48 having an inner time interval Tin less than an outer time interval Tout corresponding to time between the lower limit LL and the upper limit UL. At step 206, the processor module 50 positions the inner window 48 at the predicted sense point time Tspi (e.g. such that the sense point time Tspi is located in the inner window 48. At step 208, the processor module 50 identifies an actual sense point time Tsp1 of a measured inner sense point value 43 of the sense point SP in the inner time interval 48 and excludes one or more identified actual outer sense point values 43 of the sense point SP being both outside of the inner time interval 48 and within the outer time interval 44. At step 210, the processor module 50 calculates the frequency F of a future cycle 15,17,19 of the waveform 10 based on the actual sense point time Tsp1 (e.g. using the known waveform equation).

Further to the above, it is recognised that the upper limit UL of the outer window 44 can be based on an amplitude measure of the waveform and is determined based on selection of a multiplication factor (e.g. the multiplication factor is determined by a variable impedance value Z of the circuit 60 connected to the waveform 10 via a series resistance element R, such that a ratio between the impedance value Z and the series resistance element R defines the multiplication factor).

A further step 212 is where the inner window module decreases the inner time interval 44 for subsequent prediction calculations of the frequency F. For example when the controller device 30 is first connected to the power line 22, the synchronization system 40 may use a large inner window 48 (e.g. being a half cycle or more in time) so as to allow for initial identification of the sense point times Tsp1,2,3,4 and initial identification of the frequency. Then the inner time interval 44 can be decreased prior to subsequent positioning at the predicted sense point times Tspi. Also, in the event of the processor module 50 not identifying (i.e. failing to identify) sense point values 43 in the positioned inner windows 44 (e.g. due to a shift in the frequency outside of the expected frequency change and/or due to random line 22 noise in the voltage/current of the waveform 10), the inner window 48 can be increased to search for the potentially shifted frequency F. In other words, in the event that the predicted sense point time Tspi and associated inner window 48 is out of position (i.e. unsynchronized) with the actual sense point times Tsp1,2,3,4 of the waveform 10, the value of the inner windows 44 (i.e. Tin) can be adjusted (e.g. increased and/or decreased) in order to facilitate resynchronization of the predicted sense point time Tspi and associated inner window 48.

It is to be understood that the invention is not to be limited to the exact configuration(s) as illustrated and described herein. Accordingly, all expedient modifications readily attainable by one of ordinary skill in the art from the disclosure and teachings set forth herein, or by routine experimentation deviating therefrom, are deemed to be within the spirit and scope of the invention as defined by the appended claims.

What is claimed is:

1. A method for continuously predicting a frequency of an input line power waveform of alternating current having a maximum value, a minimum value, and a reference point having a reference value on the waveform located between the maximum and minimum values, the method comprising the steps of:

specifying an outer window defining a sense point on the waveform between a lower limit and an upper limit of the outer window, the sense point on the waveform being located a distance away from the reference point on the waveform, the sense point having a corresponding predicted sense point time;

providing an inner window having an inner time interval less than an outer time interval corresponding to time between the lower limit and the upper limit;

positioning the inner window at the predicted sense point time;

identifying, using a computer processor, an actual sense point time of a measured inner sense point value of the sense point in the inner time interval and excluding one or more identified actual outer sense point values of the sense point being both outside of the inner time interval and within the outer time interval; and calculating, using the computer processor, the frequency of a future cycle of the waveform based on the actual sense point time.

2. The method of claim 1, wherein the sense point is a voltage sense point and the measured inner sense point value is a corresponding voltage value.

3. The method of claim 2, wherein the voltage sense point on the waveform is located midway between the upper limit and the lower limit.

4. The method of claim 3, wherein the inner sense point value is measured by a sense port of a microprocessor.

5. The method of claim 1 further comprising the step of specifying the upper limit of the outer window based on an amplitude measure of the waveform.

6. The method of claim 5, wherein the upper limit is determined based on selection of a multiplication factor.

7. The method of claim 6, wherein the multiplication factor is determined by a variable impedance value of a circuit connected to the waveform via a series resistance element, such that a ratio between the impedance value and the series resistance element defines the multiplication factor.

8. The method of claim 5, wherein the lower limit is the reference value of the waveform.

9. The method of claim 1 further comprising the step of decreasing the inner time interval for subsequent prediction calculations of the frequency.

10. A system for continuously predicting a frequency of an input line power waveform of alternating current having a maximum value, a minimum value, and a reference point having a reference value on the waveform located between the maximum and minimum values, the system comprising:

an outer window module to specify an outer window defining a sense point on the waveform between a lower limit and an upper limit of the outer window, the sense point on the waveform being located a distance away from the reference point on the waveform, the sense point having a corresponding predicted sense point time;

an inner window module to provide an inner window having an inner time interval less than an outer time interval corresponding to time between the lower limit and the upper limit; and a processor module to position the inner window at the predicted sense point time, to identify an actual sense point time of a measured inner sense point value of the sense point in the inner time interval and excluding one or more identified actual outer sense point values of the sense point being both outside of the inner time interval and within the outer time interval, and to calculate the frequency of a future cycle of the waveform based on the actual sense point time.

11. The system of claim 10, wherein the sense point is a voltage sense point and the measured inner sense point value is a corresponding voltage value.

12. The system of claim 11, wherein the voltage sense point is located midway between the upper limit and the lower limit.

13. The system of claim 12, wherein the inner sense point value is measured by a sense port of a microprocessor as the processor module.

14. The system of claim 10 further comprising the outer window module configured to specify the upper limit of the outer window based on an amplitude measure of the waveform.

15. The system of claim 14, wherein the lower limit is the reference value of the waveform.

16. The system of claim 15, wherein the reference value is zero.

17. The system of claim 14, wherein the upper limit is determined based on selection of a multiplication factor.

18. The system of claim 17, wherein the outer window module includes a circuit and the multiplication factor is determined by a variable impedance value of the circuit connected to the waveform via a series resistance element, such that a ratio between the impedance value and the series resistance element defines the multiplication factor.

19. The system of claim 10 further comprising the outer window module configured to decrease the inner time interval for subsequent prediction calculations of the frequency.

20. A fluorescent lighting system to more efficiently use and conserve an AC input power by applying a reduced power AC output power to fluorescent lighting while providing operational lighting intensity for the fluorescent lighting, the system comprising:

one or more fluorescent lights for receiving the reduced power AC output power;

a subsystem for continuously predicting a frequency of the AC input line power waveform having a maximum value, a minimum value, and a reference point having a reference value on the waveform located between the maximum and minimum values, the subsystem comprising:

an outer window module to specify an outer window defining a sense point on the waveform between a lower limit and an upper limit of the outer window, the sense point on the waveform being located a distance away from the reference point on the waveform, the sense point having a corresponding predicted sense point time;

an inner window module to provide an inner window having an inner time interval less than an outer time interval corresponding to time between the lower limit and the upper limit; and a processor module to position the inner window at the predicted sense point time, to identify an actual sense point time of a measured inner sense point value of the sense point in the inner time interval and excluding one or more identified actual outer sense point values of the sense point being both outside of the inner time interval and within the outer time interval, and to calculate the frequency of a future cycle of the waveform based on the actual sense point time; and a controller device for modifying the AC input power to provide the reduced power AC output power to the one or more fluorescent lights when coupled to the controller device, the AC output power having a series of cut-out pulses in half cycles of the AC output power waveform, the frequency of the waveform of the AC input power provided by the subsystem for continuously predicting the frequency for positioning of the series of cut-out pulses.

* * * * *